United States Patent [19]
Schmidt et al.

[11] Patent Number: 5,157,724
[45] Date of Patent: Oct. 20, 1992

[54] WEIGHTED TELEPHONE BASE ASSEMBLY

[75] Inventors: James N. Schmidt, London; Robert M. Parker, Mt. Brydges, both of Canada

[73] Assignee: Northern Telecom Limited, Montreal, Canada

[21] Appl. No.: 774,507

[22] Filed: Oct. 10, 1991

[51] Int. Cl.⁵ .............................................. H04M 1/00
[52] U.S. Cl. .................................... 379/436; 379/369; 379/429
[58] Field of Search ............... 379/436, 435, 440, 428, 379/429, 419, 369, 368

[56] References Cited

U.S. PATENT DOCUMENTS

| | | | |
|---|---|---|---|
| 2,726,292 | 12/1955 | Sargisson et al. | 379/369 |
| 2,862,063 | 11/1958 | Wood | 379/369 |
| 3,136,865 | 6/1964 | Nise et al. | 379/436 |
| 3,293,375 | 12/1966 | Lohs | 379/428 |
| 4,710,954 | 12/1987 | Doyle et al. | 379/429 |

FOREIGN PATENT DOCUMENTS 267551 1/1965 Australia ............... 379/428

*Primary Examiner*—James L. Dwyer
*Assistant Examiner*—Jack Chiang
*Attorney, Agent, or Firm*—Angela C. de Wilton

[57] ABSTRACT

A weighted telephone base assembly and a method of providing a weighted telephone assembly. The telephone base assembly comprises a telephone housing having a base member, first and second printed circuit boards, and a weight having first and second parts. The base assembly is provided by locating and supporting the first part of the weight and the first circuit board upon the base member with the first circuit board overlying the first part of the weight in a space defined between the first and second parts of the weight; retaining the first circuit board upon the base member by latch means whereby the first part of the weight is removably retained upon the base member; and positioning the second circuit board on a support surface provided by a second part of the weight, so that the second circuit board is supported by the weight. Thus the weight has a first part supported by the base member, and the first printed circuit board is also supported by the base member and overlies the first part of the weight; the weight also has a second part extending upwardly from, supported by and spaced from the first part of the weight and overlying at least part of the first printed circuit board, and the second part supports the second printed circuit board. Preferably the second circuit boards forms part of a keypad assembly and the housing also comprises a cover applied over the keypad assembly and secured to the base member with buttons of the keypad assembly operable through the housing. The cover engages the keypad assembly and is cooperable with the support surface of the weight to hold the keypad assembly immovably within the housing of the telephone base assembly.

14 Claims, 3 Drawing Sheets

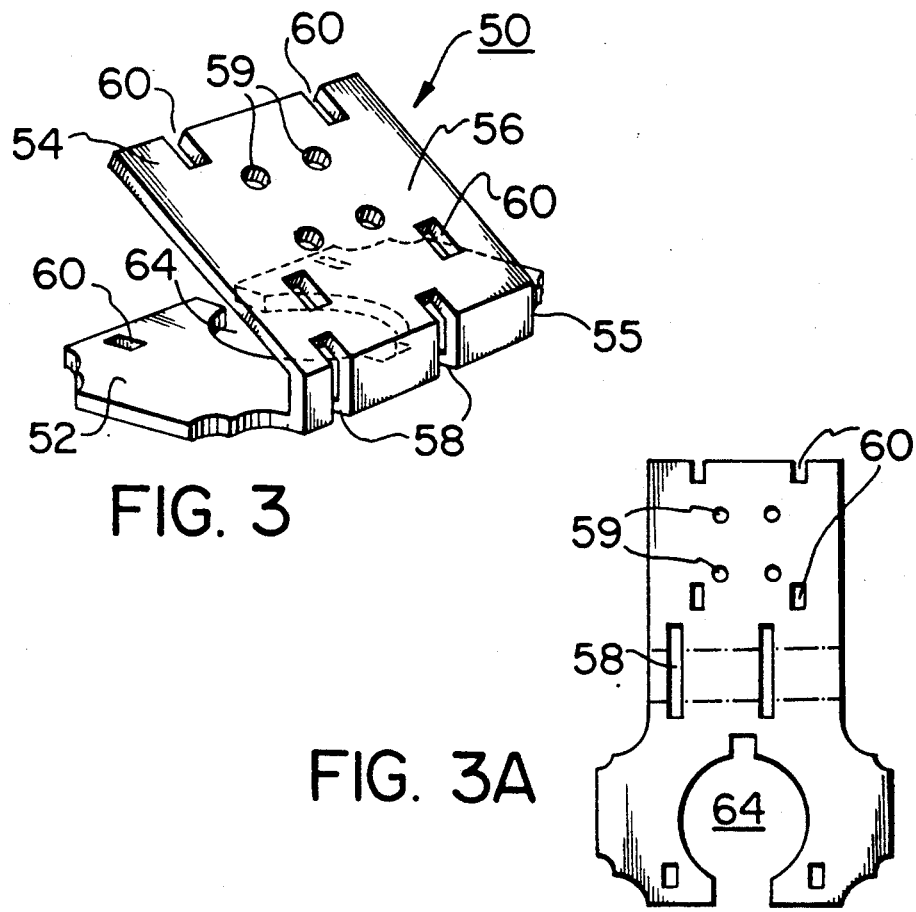
FIG. 3
FIG. 3A
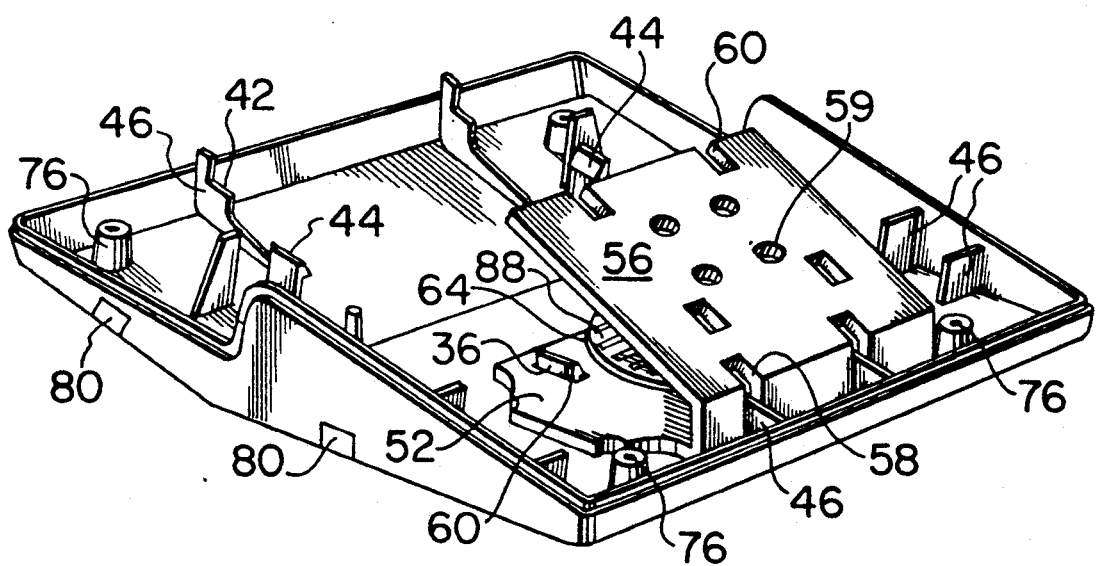
FIG. 4

WEIGHTED TELEPHONE BASE ASSEMBLY

FIELD OF THE INVENTION

This invention relates to a weighted telephone base assembly.

BACKGROUND OF THE INVENTION

Telephone base assemblies now generally comprise a lightweight housing of a plastic material enclosing the working parts of the telephone, that is, electronic components, which include a keypad or pushbutton assembly, supported on one or more printed circuit boards within a lower region of a base member of the housing of the assembly. Thus, lightweight telephones of a compact design may be provided. Nevertheless, it is found that customers have a tendency to prefer a heavier telephone as they perceive it to be functionally superior to a lightweight telephone. So, to provide weight in a telephone constructed from lightweight plastic materials and components, it is known to have lead composition weights distributed in various parts of the base member of the housing of the telephone base assembly. However, this is inconvenient and impractical in design and it is preferable to avoid the use of lead for environmental reasons. To overcome this problem, more recent telephones contain a larger metal plate, of a metal less dense than lead, which is fitted into the bottom, or lower part, of the telephone base member and screwed down. The plate may be formed from, for example, a sheet of cold rolled steel and coated with a corrosion resistant plating. Clearance holes for screws may conveniently be punched in the steel plate. Thus the structure is simple and easily manufactured.

Where it is desirable to increase the weight further, the use of a thicker plate requires a more complex method of manufacture, i.e. cutting and drilling, rather than punching, of screw receiving holes, thus adding to the complexity of manufacture and assembly.

Further, in many recent telephones constructions, it is desired to accommodate two or more printed circuit boards arranged one above the other within the telephone base assembly. Therefore, the use of more than one plate or a thicker plate for the purpose of increasing the weight takes up an unacceptable amount of space, requiring the circuit boards to be spaced closely together within the telephone base assembly. Where a second circuit board carries a keypad and is supported by an underlying circuit board, there is risk of damage to the underlying circuit board by excessive pressure exerted on it during operation of the keypad.

SUMMARY OF THE INVENTION

The present invention seeks to provide a weighted telephone base assembly in which the above mentioned problems are avoided or reduced.

According to one aspect of the invention there is provided a telephone base assembly comprising: a telephone housing having a base member, first and second printed circuit boards, and a weight, the weight having a first part supported by the base member, the first printed circuit board also supported by the base member and overlying the first part of the weight, the weight also having a second part extending upwardly from, supported by and spaced from the first part of the weight and overlying at least part of the first printed circuit board, the second part supporting the second printed circuit board.

Thus the telephone assembly includes a weight which has first and second parts, with space between the parts to accommodate a first circuit board. The second part of the weight also functions as a rigid support for a second printed circuit board overlying the first circuit board. Thus the second circuit board is supported independently from the first circuit board, and the heaviness increased by the second part of the weight extending between the circuit boards.

Preferably, the second circuit board forms part of a keypad assembly, and the second part of the weight provides a support surface which is inclined relative to the first part for supporting the second circuit board. The keypad assembly is hence provided with the firm support of the second part of the weighted support member, so as to avoid damage to the keypad assembly or the underlying components when downward pressure is applied in use of pushbuttons of the keypad.

In an advantageous and convenient construction of the assembly, a cover of the telephone housing is received over the keypad assembly and engages surfaces of the keypad assembly around the pushbuttons of the keypad assembly so at to retain the latter immovably on the support surface and also to hold the weight securely within the housing when the cover is secured to the base member.

In a practical construction, the weight has the form of a V shaped bracket, the first and second parts of the support member each being planar and forming the two arms of the V shape. In the assembly the weight is contained in the housing with one planar part resting horizontally in the base member and the other planar part inclined relative to the first part. The first and second parts of the bracket are perforated by holes and slots to allow passage therethrough of alignment posts and supports for the circuit board which extend upwards from the base member. The bracket may also be shaped to define larger apertures for components, such as parts of a tone alerter, which extend through the bracket from the circuit board.

According to another aspect of the invention, there is provided a method of providing a weighted telephone assembly comprising: providing a housing having a base member, first and second circuit boards and a weight having first and second parts, locating and supporting the first part of the weight and the first circuit board upon the base member with the first circuit board overlying the first part of the weight in a space defined between the first and second parts of the weight; retaining the first circuit board upon the base member by latch means whereby the first part of the weight is removably retained upon the base member; and positioning the second circuit board on a support surface provided by a second part of the weight, so that the second circuit board is supported by the weight.

Preferably, where the second circuit board comprises a keypad assembly, the method comprises applying a cover over the keypad assembly and securing the cover to the base member whereby buttons of the keypad assembly are operable through the cover and the cover engages the keypad assembly and is cooperable with the support surface of the weight to hold the keypad assembly immovably within the housing of the telephone base assembly.

It is also convenient for the second printed circuit board to be assembled to the second part of the weight by use of resilient latches. With such an arrangement, the assembly is easily put together without special tools and with a minimum number of screws or other separate fasteners. Such a construction is convenient for providing modular telephone base assemblies having readily interchangeable, easily assembled modular parts so as to reduce servicing and maintenance costs.

BRIEF DESCRIPTION OF THE DRAWINGS

An embodiment of the invention will now be described by way of example, with reference to the accompanying drawings, in which:

FIGS. 3-3A are an isometric view of a weight forming part of the assembly shown in FIG. 2;

FIGS. 4 and 5 are isometric views showing partially assembled components of the telephone base assembly.

DESCRIPTION OF THE PREFERRED EMBODIMENT

Figure 1:
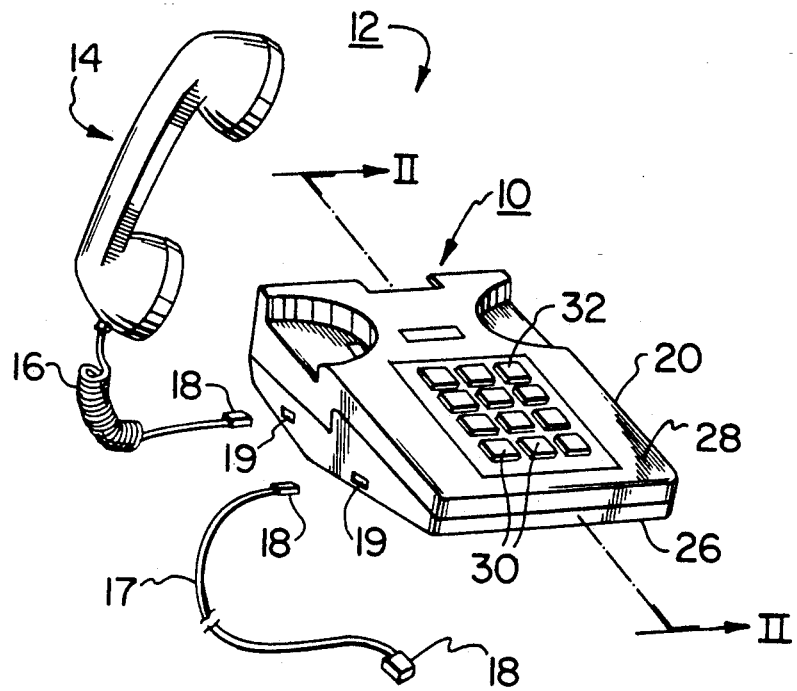
FIG. 1 is a perspective view of a telephone set including a telephone base assembly according to the embodiment of the invention.
Figure 2:
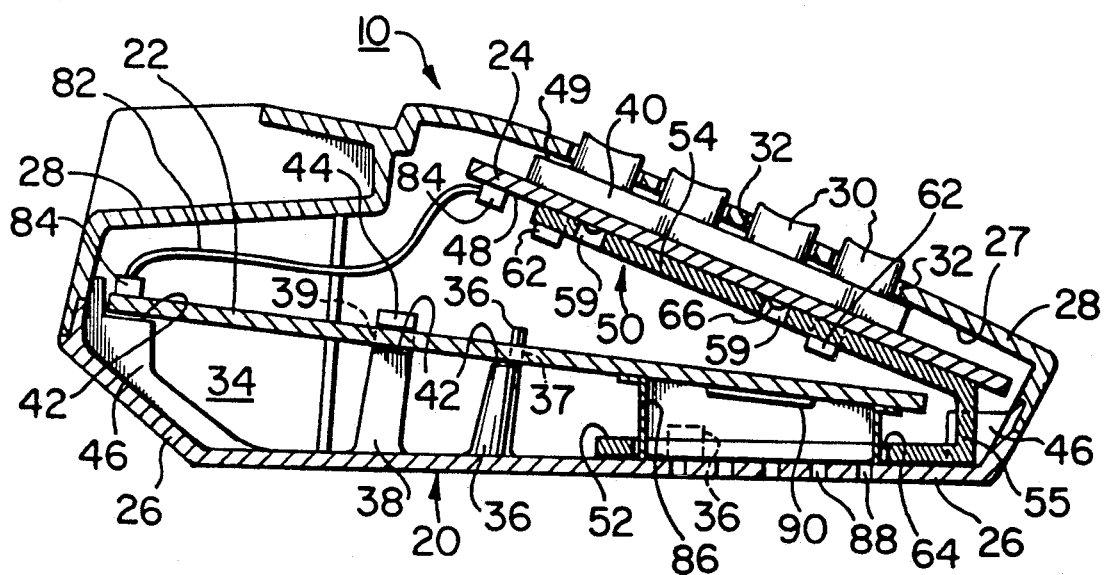
FIG. 2 is a cross-sectional side view of the telephone base assembly taken along line II—II in FIG. 1 and to a larger scale.

A telephone base assembly 10 according to the embodiment of the present invention and parts thereof are shown in FIGS. 1 to 4. The base assembly 10 forms part of a modular telephone set 12 (FIG. 1), which includes the handset 14, with a detachable handset cord 16 and line cord 17 having modular plugs 18. The base assembly 10 comprises a plastic housing 20, which contains the main working parts, that is, first and second printed circuit boards 22 and 24 and their surface mounted components (not shown). The housing 20 comprises two separable parts, a lower part or base member 26 and an upper part or cover 28. The second circuit board 24 comprises part of a keypad assembly 40 having pushbuttons 30. The pushbuttons 30 extend through corresponding aligned holes 32 in the cover 28.

A weight 50 in the form of a V shaped bracket (FIG. 3) formed from sheet steel and coated with a corrosion resistant plating of bronze, has generally planar first and second parts 52 and 54 provided by the arms of the V shape. FIG. 3 shows the first part 52 resting horizontally as it would be received upon the base member 26 of the base assembly 10. The second part 54 extends upwardly from and overlies the first part 52, has an short upstanding portion 55, and is inclined to provide a planar support surface 56 inclined relative to the plane of the first part 52. The first and second parts are spaced apart with the second part 54 overlying part of the first part 52 to define a space 53 therebetween for accommodating the first circuit board 22 circuit board, as will be described. For reasons discussed below, the weight has slots 58 and 60 and perforations 59, and the first part 52 is C shaped, defining a near circular aperture 64.

Figure 5:
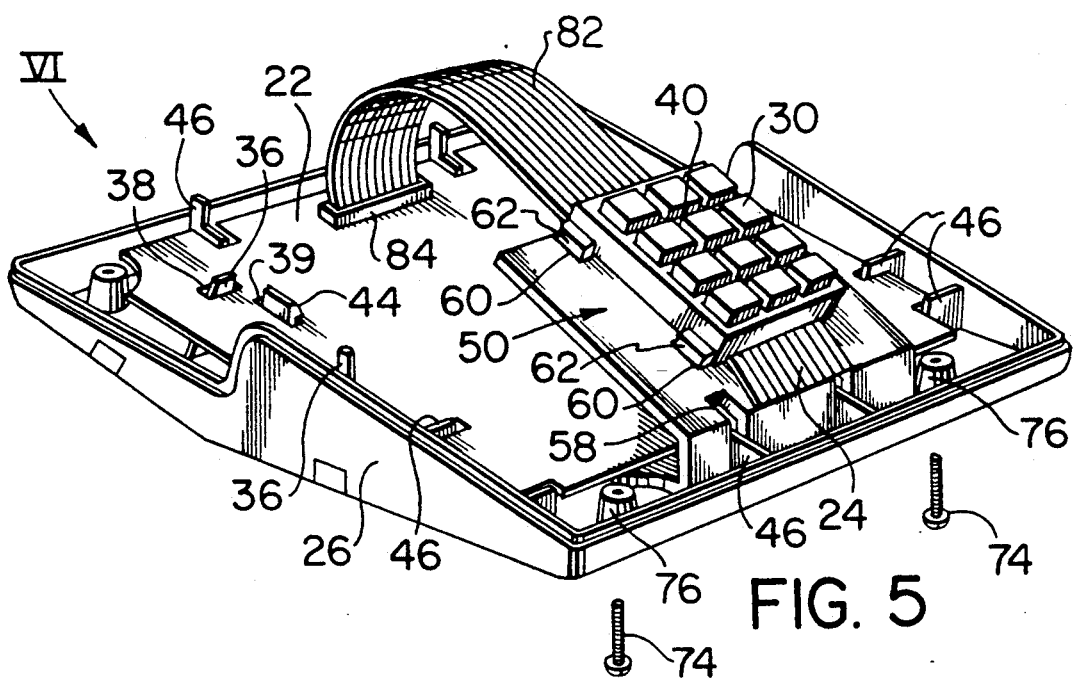
Figure 6:
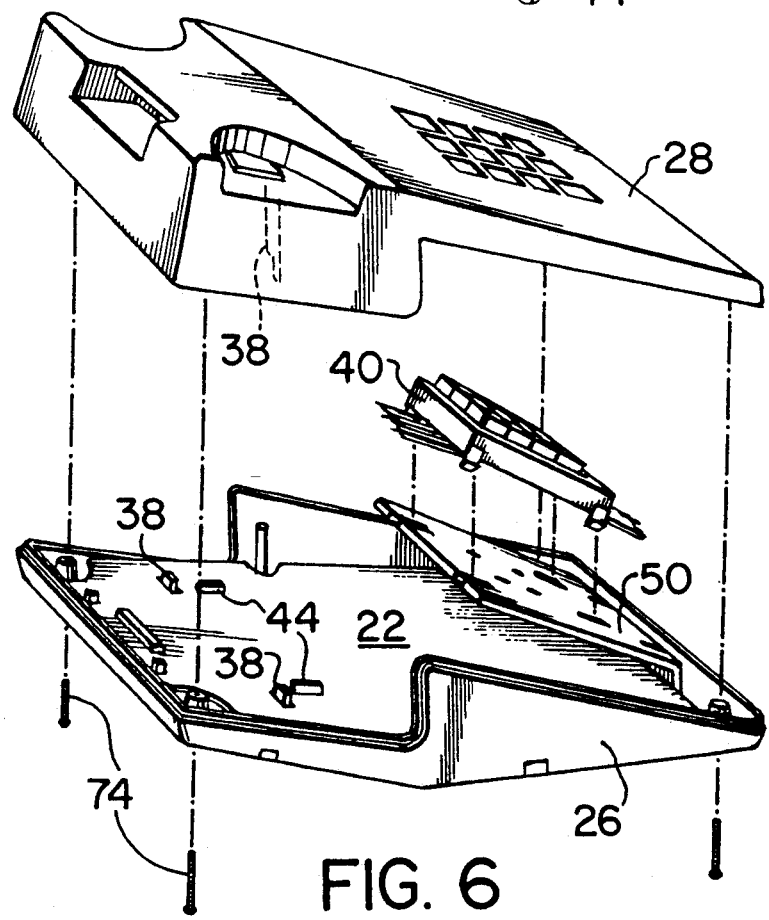
FIG. 6 is an isometric exploded view in the direction of arrow VI of FIG. 5.

In the assembly (FIGS. 2, 4 and 5), the weight 50 is received within the housing 20 with the planar first part 52 carried horizontally within the lower region 34 of the base member 26 and extending underneath circuit board 22. Location and supporting means for the circuit board 22 include circuit board support posts 38 of the base member 26 which extend through the slots 60 in the first part of the weight and align the weight 50 correctly within the base member 26 of the housing 20. The slots 60 are slightly oversized, sufficient to provide clearance to simplify location of the weight 50 within the base member 26.

The first circuit board 22 is supported also above the first part 52 of the weight and within the lower region 34 of base member 26 by upwardly facing surfaces 42 of the support posts 36 and 38 which extend upwards from the base member. Parts of the support posts 36 and 38 extend through corresponding aligned holes 37 and 39 in the circuit board 22 for location purposes. The circuit board also rests on and is supported by upwardly facing support surfaces 42 provided by each of a plurality of projections 46 of sidewalls of the base member. Resilient latch means is provided for releasably retaining the circuit board 22 in position. The latch means comprises latches 44 provided on posts 38 which extend through holes 39 in the board 22 and engage the upper surface 23 of the board 22. The posts 38 with latches 44 retain the printed circuit board 22, and also hold the weight 50 captive, sandwiched between the base member 26 and the circuit board 22 to prevent removal of the weight from the base member.

The second circuit 24 board, which forms part of the keypad assembly 40, is supported on the support surface 56 so as to be overlying part of the first circuit board 22. The weight 50 provides a rigid support for the keypad assembly 40 independently of the first circuit board. Latches 62 of the keypad assembly 40 are received in slots 60 through the second part 54 of the weight to position the keypad assembly 40 on the surface 56. Also, protrusions 47 formed by heat stake pins on the underside 48 of the keypad assembly 40 are received in oversized perforations 59 in the second part 54 of the weight. Clearance around the latches 62 within the slots 60 allows for some lateral adjustment of the keypad assembly 40 as it is supported by the weight 50.

The first circuit board 22 is supported by the base member 26 and is held between first and second parts, 52 and 54, of the weight 50 and beneath the keypad assembly 40. The latter is firmly supported independently of the first circuit board 22 so that, in use of the keypad, downward pressure on the pushbuttons 30 is not transmitted to the first circuit board 22, and thus damage to the first circuit board 22 by pressure from operation of the overlying keypad assembly 40 is avoided. The rigid support surface 56 also reduces flexing and damage to the second circuit board 24.

A cover 28 of the housing 20 is downwardly slidably received over the keypad assembly 40 with the set of holes 32 in the cover 26 aligned over corresponding pushbuttons 30 of the keypad assembly 40 An inner surface 27 of the cover 28 engages the upper surface 49 of the keypad assembly around the pushbuttons 30. The cover 28 is retained by four corner screws 74 passing through screw clearance holes 76 in the base member and received in threaded screw receiving holes ( not shown) in the cover 28. The cover 28 engages the upper surface 49 of the keypad assembly while the second part of the weight 54 supports and engages the underside 48 of the circuit board carrying the keypad and holds the keypad assembly 40 immovably within the base assembly 10 during operation of the pushbuttons. Further, the cover 28 in engaging the upper surface 49 of the keypad assembly, holds the weight 50 downwardly to hold it immovably in position within the housing.

Thus, the weight, the first circuit board and the keypad assembly including the second circuit board of the telephone base assembly 10, as shown in FIGS. 3 and 4, are positioned within the base member by the support posts 36 and 38 and retained by only a pair of resilient latches 44, eliminating the necessity for separate fasteners and the use of special tools for assembly.

In a method of assembly of the base assembly 10 of the embodiment, the first printed circuit board 22 is positioned between the first and second parts 52, 54 of the weight 50, and the weight 50 and the circuit board 22 are inserted together into the base member 26 so that the first part of the weight is received within the lower region 34 of the base member 26 with location posts 38 and 36 aligned with corresponding slots 60 in the weight and holes 37 and 39 in the circuit board respectively. In this position, the housing 86 for a transducer 90 of a tone alerter is disposed within the aperture 64 with the transducer 90 directed towards a grille 88 in the base member of the housing. Once the weight 50 and the circuit board 22 are correctly aligned, they are pressed towards the base member 26 to engage circuit board 22 against the support surfaces 42 of the location posts 36 and 38 and the projections 46, and to cause the two resilient latches 44 of posts 38 to engage surfaces 23 of the first printed circuit board 22 around holes 39. The posts 36 and 38 and resilient latches 44 engage and retain the circuit board securely and immovably in a desired position. In contrast, clearance between the posts 36 and the slots 60 through the weight 50 allows for some lateral movement of the weight within the base member 26. The keypad assembly is placed on the support surface 56 with latches 62 extending through aligned slots 60. Again, clearance in slots 60 around latches 62 allows for some lateral adjustment of the keypad assembly on the weight 50. At this stage of assembly the weight 50 is held captive by the posts 36 and 38 and the circuit board 22, but is only loosely retained. The cover 28 is then positioned over the retained keypad assembly with apertures 32 of the cover aligned with pushbuttons 30 of the keypad assembly 40. Cover 28 provides for sliding fit of holes 32 around pushbuttons 30. Slight movement of the cover 28 with the keypad assembly 40, relative to the weight and slight movement of the loosely retained weight relative to the base member 26 may be necessary to align correctly the cover, keypad assembly and weight within the housing, and then the cover 28 is secured to the base member 26 with screws 74. Engagement of the inner surface 27 of the cover 28 against the upper surface 49 of the keypad assembly 40, urges the weight 50 towards the base member and holds the weight 50 immovably sandwiched between the base member 26 and the keypad assembly 40, which is also held immovably in place.

Electrical connection between the first and second printed circuit boards within the assembly is provided by a modular ribbon cable 82 and modular connectors 84 on one or both circuit boards, so that the two circuit boards are separable. The modular plugs 18 are connected to modular jacks 19 provided on the circuit boards 22 for insertion of line cord 17 and hand-set 16 cord plugs through corresponding apertures 80 in the housing. The base assembly 10 is thus completely modular for ease of servicing and replacement of defective parts and can easily be dismantled and reassembled rapidly on site, without special tools. Disassembly requires only removal of the screws 74 and the cover 28 and then release of the two resilient latches 44 to enable the circuit boards 22, 24 and the weight 50 to be removed from the base member.

Conveniently, the weight 50 is manufactured by stamping and bending from sheet steel or other suitably dense metal. With the use of the two parts 52 and 54 of the weight, the heaviness of the weight may be as desired without having an inordinate thickness of each part 52 and 54. In this way the weight is easily shaped to accommodate different components of the working parts of the telephone, with the various holes or slots being stamped out as required (as distinct from cutting or drilling holes and slots).

The first and second parts of the weight 50 together provide a comparable weight to a pair of plates screwed into the base, but it will be clear that in modifications, the weight may be of any suitable size and shape to provide a desired weight distribution, balance, and stability to a telephone base assembly, while accommodating one or more circuit boards and the electronic components mounted thereon within the base assembly. The second part of the weight occupies space between the circuit boards and does not take up additional space in the lower region of the base member. The second part also provides independent support for the second circuit board, which is advantageous especially for support of a keypad to prevent damage to the underlying circuit board. In addition, the method assembly is simple, the first circuit board being securely and releasably retained by two resilient latches only, while the second circuit board and the weight are immovably retained by securing the cover of the assembly.

What is claimed is:

1. A telephone base assembly comprising:
a telephone housing having a base member;
a first and a second printed circuit boards;
and a weight;
the weight formed from rigid sheet metal and having first and second rigid parts, the second part extending upwardly from, supported by, and spaced from the first part of the weight with the second part of the weight overlying the first part of the weight;
the weight being located on the base member with the first part of the weight supported by the base member and the second part of the weight overlying the first part, the first circuit board being received between first and second parts of the weight and the second printed circuit board being received upon the second rigid part of the weight.

2. An assembly according to claim 1 wherein the second printed circuit board forms part of a keypad assembly.

3. An assembly according to claim 2 wherein the first part is planar and the second part provides a planar support surface which is inclined relative to the first part.

4. An assembly according to claim 2 wherein the first part of the weight is planar and the second part provides a planar support surface which is inclined relative to the first part, and a cover of the telephone housing is received over the keypad assembly, the support surface extending beneath the cover and supporting the keypad assembly with pushbuttons of the keypad assembly operable through apertures provided in the cover of the housing, the keypad assembly being engaged on opposing sides by the support surface and the cover to hold the keypad assembly immovably within the telephone housing.

5. The assembly according to claim 4 wherein the cover engages surfaces of the keypad assembly around the pushbuttons.

6. An assembly according to any one of claims 1 and 2 to 5 wherein the base member provides support and location means for the first printed circuit board and for the weight, and latch means is provided for releasably retaining the printed circuit board assembly to the base member.

7. An assembly according to claim 6 wherein the latch means comprise resilient latches of the base member which are received in latch receiving spaces of the first circuit board to engage and retain the first circuit board, and the weight is releasably held captive to the base member of the housing.

8. An assembly according to claim 7 wherein the latches extend through apertures in the first part of the weight.

9. An assembly according to claim 4 wherein the base member provides support and location means for the first printed circuit board and for the weight, and latches of the base member are received in latch receiving spaces of the first printed circuit board and engage the circuit board to hold the weight and the circuit board releasably captive to the base member of the housing;

the keypad assembly and the second part of the weight have cooperable means for positioning the keypad assembly on the support surface; and the cover of the telephone housing is received over the keypad assembly and secured to the base member with the cover engaged downwardly against the keypad assembly to secure the keypad assembly and the weight immovably within the telephone housing.

10. An assembly according to claim 1 wherein the weight is stamped and formed from the sheet metal.

11. A method of providing a weighted telephone assembly comprising:

providing a housing having a base member, first and second circuit boards, and a weight formed from rigid sheet metal and having first and second parts, the second part of the weight supported by and spaced from the first part;

locating and supporting the first part of the weight and the first circuit board upon the base member with the first circuit board overlying the first part of the weight in a space defined between the first and second parts of the weight;

retaining the first part of the weight upon the base member by latch means whereby the first part of the weight is removably retained upon the base member;

and positioning the second circuit board on a support surface provided by the second part of the weight, so that the second circuit board is supported by the weight.

12. A method according to claim 11 wherein the second circuit board forms part of a keypad assembly and the housing also comprises a cover, and comprising:

applying the cover of the housing over the keypad assembly and securing the cover to the base member whereby buttons of the keypad assembly are operable through the housing and the cover engages the keypad assembly and is cooperable with the support surface of the weight to hold the keypad assembly immovably within the housing of the telephone base assembly.

13. A method according to claim 11 comprising inserting the weight into the base member and then inserting and retaining the first circuit board.

14. A method according to claim 12 comprising causing the cover to engage downwardly against the keypad assembly as the cover is being applied so as to secure the keypad assembly and the weight immovably within the housing.

* * * * *